(12) United States Patent
Kamal et al.

(10) Patent No.: US 6,242,348 B1
(45) Date of Patent: Jun. 5, 2001

(54) METHOD FOR THE FORMATION OF A BORON-DOPED SILICON GATE LAYER UNDERLYING A COBALT SILICIDE LAYER

(75) Inventors: Abu-Hena Mostafa Kamal, Sunnyvale; Amjad Obeidat, San Francisco, both of CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/411,566

(22) Filed: Oct. 4, 1999

(51) Int. Cl.$^7$ ................................................ H01L 21/44
(52) U.S. Cl. ........................... 438/682; 438/592; 438/649
(58) Field of Search ..................................... 438/532, 533, 438/585, 592, 516, 682, 683, 649

(56) References Cited

U.S. PATENT DOCUMENTS 5,608,266 * 3/1997 Agnello et al. ...................... 257/768

OTHER PUBLICATIONS

S. Wolf and R.N. Tauber, Silicon Processing for the VLSI Era, vol. 1— *Process Technology*, pp. 280–283, 388–399 (Lattice Press, 1986).

W.K. Lai, et al., A Novel Process To Form Cobalt Silicided p$^+$Poly–Si Gates by BF$_2$·Implantation into Bilayered CoSi/ a–Si Films and Subsequent Anneal, IEEE Electron Device Lett., vol. 19, p. 259 (1998).

M.H. Juang, et al., Shallow Junctions Formed by BF2+ Implantation into Thin CoSi Films and Rapid Thermal Annealing, J. Appl. Phys., vol. 76, p. 323 (1994).

H.C. Cheng, et al., A Silicidation–Induced Process Consideration for Forming Scale–Down Silicided Junction, IEEE Electron Device Lett., vol. 15, No. 9, p. 342 (1994).

Wei–Ming Chen, et al., Thermal Stability and Dopant Drive–out Characteristics of CoSi$_2$ Polycide Gates, J. Appl. Phys., vol. 73, p. 4712 (1993).

Wein–Town Sun, et al., Suppression of Cobalt Silicide Agglomeration Using Nitrogen (N$_{2^+}$) Implantation, IEEE Electron Device Lett., vol. 19, p. 163 (1998).

G.J. van Gurp, et al., Interactions in the Co/Si Thin–Film System. II. Diffusion–Marker Experiments, J. Appl. Phys., pp. 49, 4011 (1978).

T. Barge, et al., Cobalt Lattice Diffusion in Bulk Cobalt Disilicide, Appl. Surf. Sci., pp. 53, 180 (1991).

* cited by examiner

*Primary Examiner*—Tuan H. Nguyen
(74) *Attorney, Agent, or Firm*—Stallman & Pollock LLP

(57) ABSTRACT

Process for forming a boron-doped silicon gate layer underlying a cobalt silicide layer that reduces the risk of grooving and agglomeration of cobalt silicide layer, as well as boron penetration into a gate oxide layer. The process includes providing a PMOS transistor structure that includes an N-well on a P-type silicon substrate, a gate oxide layer and a silicon gate layer. Next, a cobalt layer is deposited on the PMOS transistor structure, which is then subjected to a first thermal treatment to form a bilayer CoSi/silicon stack structure. After removing unreacted cobalt, boron dopant (BF$_2^+$ or B$^+$) and nitrogen ions (N$_2^+$) are implanted into the bilayer CoSi/silicon stack structure. The bilayer CoSi/silicon stack structure, implanted boron and implanted nitrogen are then subjected to second thermal treatment to form a CoSi$_2$ layer on the silicon gate layer and to thermally activate the implanted boron. Also included is a process where a PMOS transistor structure that includes an N-well on a P-type silicon substrate, a gate oxide layer and a silicon gate layer is first provided, followed by the implantation of nitrogen into the silicon gate layer. Next, a cobalt layer is deposited on the PMOS transistor structure, which is then subjected to a first thermal treatment to form a bilayer CoSi/silicon stack structure. After removing unreacted cobalt, boron is implanted into the bilayer CoSi/silicon stack structure. The bilayer CoSi/silicon stack structure and implanted boron and implanted nitrogen are then subjected to second thermal treatment to form a CoSi$_2$ layer and to thermally activate the implanted boron.

10 Claims, 4 Drawing Sheets

METHOD FOR THE FORMATION OF A BORON-DOPED SILICON GATE LAYER UNDERLYING A COBALT SILICIDE LAYER

BACKGROUND OF THE INVENTION

1. Field of the Invention

The present invention relates to semiconductor device fabrication and, in particular, to processes for forming a boron-doped silicon gate layer underlying a cobalt silicide layer.

2. Description of the Related Art

The fabrication of semiconductor devices involves the processing of a semiconductor substrate (e.g. a silicon wafer) through a series of steps, including multiple ion implantation processes. During such an ion implantation process, dopant atoms are introduced into, and below, the surface of the semiconductor substrate and into various layers (e.g. a polysilicon gate layer) which have been formed on the semiconductor substrate. The dopant atoms are added to the semiconductor substrate to form various device regions, such as well regions, Lightly Doped Drain (LDD) extension regions, and source and drain regions. The dopant atoms are also introduced into the semiconductor substrate to modify the electrical characteristics of the semiconductor device; for example, to reduce the sheet resistance of a polysilicon gate layer. See S. Wolf and R. N. Tauber, *Silicon Processing for the VLSI Era, Volume 1—Process Technology*, pp. 280–283, Lattice Press (1986), which is hereby incorporated by reference, for a further discussion of ion implantation processes.

In Metal-Oxide-Semiconductor (MOS) device manufacturing, self-aligned metal silicide layers (also known as "salicide" layers) are useful in reducing the sheet resistance of polysilicon interconnections, source regions and drains regions, as well as contact resistance. See, for example, Stanley Wolf, *Silicon Processing for the VLSI Era*, Vol. I, 388–399 (Lattice Press, 1986).

Figure 1:
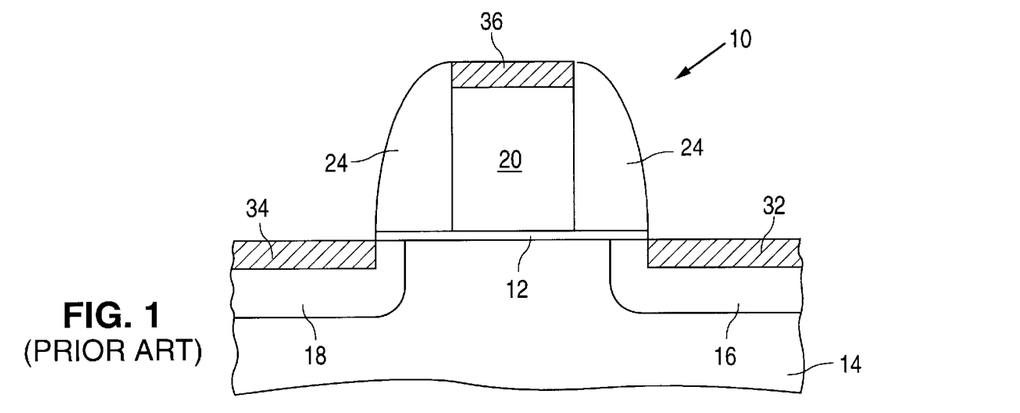
FIG. 1 is a cross-sectional view of a conventional PMOS transistor structure.

Referring to FIG. 1, a representative conventional PMOS transistor structure 10 is illustrated. Conventional PMOS transistor structure 10 includes a gate oxide layer 12 overlying N-type silicon substrate 14 between P-type drain region 16 and P-type source region 18, both of which are formed in N-type silicon substrate 14. A conventional PMOS transistor structure 10 also includes a boron-doped polysilicon gate layer 20 overlying gate oxide layer 12. Gate sidewall spacers 24, typically formed of silicon dioxide or silicon nitride, are disposed on the lateral surfaces of boron-doped polysilicon gate layer 20 and gate oxide layer 12. Conventional PMOS transistor structure 10 further includes cobalt silicide layers 32, 34 and 36 on the drain region 16, the source region 18 and the boron-doped polysilicon gate layer 20, respectively.

The drawbacks of conventional processes used to fabricate PMOS transistor devices include (i) increased risk of boron dopant penetration into and through the gate oxide layer as fabrication processes progress to 0.10 µm devices and (ii) instability of the cobalt silicide layers (for example, agglomeration and "grooving" of the cobalt silicide layer along polysilicon grain boundaries in the boron-doped polysilicon gate layer). Boron dopant penetration can degrade the performance of PMOS transistor devices by causing a flat-band voltage shift, and an increase in both sub-threshold swing and leakage current. Boron dopant penetration from the boron-doped polysilicon gate layer into the gate oxide layer can also deteriorate the quality of the gate oxide layer. Further, cobalt silicide, which comes into contact with the gate oxide layer via a "grooving" mechanism, can have a detrimental effect on semiconductor device fabrication yield.

Semiconductor device fabrication processes which employ implantation of $BF_2+$ into a CoSi/amorphous silicon bilayer have been reported to be effective in suppressing boron penetration in PMOS devices. See W. K. Lai, et al., A Novel Process to Form Cobalt Silicided $p^+$ Poly-Si Gates by $BF_2^+$ Implantation into Bilayered CoSi/a-Si Films and Subsequent Anneal, IEEE Electron Device Lett., Vol. 19, 259 (1998), which is hereby incorporated by reference. The use of CoSi layer as an implantation barrier and as a diffusion source has also been shown to be effective in reducing boron diffusion during the formation of shallow junction regions (e.g. source and drain regions). See M. H. Juang, et al., Shallow Junctions Formed by $BF2^+$ Implantation into Thin CoSi Films and Rapid Thermal Annealing, J. Appl. Phys., vol. 76, 323, (1994), and H. C. Cheng, et al., "A Silicidation-Induced Process Consideration for Forming Scale-down Silicided Junction," IEEE Electron Device Lett., vol. 15, no. 9, 342 (1994), both of which are hereby incorporated by reference.

Significant improvement in the thermal stability of $CoSi_2$ layers can be achieved by implanting low energy (e.g. 20 KeV) $BF_2^+$ into $CoSi_2$ layers formed on as-deposited amorphous silicon gate layers (300 nm), compared to $CoSi_2$ layers formed on as-deposited polysilicon gate layers. See Wei-Ming Chen, et al., Thermal Stability and Dopant Drive-out Characteristics of $CoSi_2$ Polycide Gates, J. Appl. Phys., vol. 73, p. 4712, (1993), which is hereby incorporated by reference.

Nitrogen implantation prior to cobalt layer deposition has been reported to suppress $CoSi_2$ agglomeration during subsequent cobalt silicide formation. For example, the thermal stability of a cobalt silicide layer disposed on a p-type doped polysilicon gate layer has been reported to be dramatically improved, if $N_2^+$ is implanted into the p-type doped polysilicon layer prior to cobalt layer deposition and cobalt silicide formation. See Wein-Town Sun et al., Suppression of Cobalt Silicide Agglomeration Using Nitrogen ($N_2^+$) Implantation, IEEE Electron Device Lett., vol. 19, 163 (1998), which is hereby incorporated by reference.

None of the reported processes, however, provide a method for forming a boron-doped silicon gate layer underlying a cobalt silicide layer that simultaneously minimizes grooving and agglomeration of cobalt silicide layer, as well as boron dopant penetration into and through a gate oxide layer. There is, therefore, still a need in the art for such a process.

SUMMARY OF THE INVENTION

The present invention provides processes for forming a boron-doped silicon gate layer underlying a cobalt silicide layer that simultaneously minimizes grooving and agglomeration of cobalt silicide layer, as well as boron dopant penetration into and through the gate oxide layer. A process according to the present invention includes first providing a PMOS transistor structure including an N-type silicon substrate, a gate oxide layer on the silicon substrate, and a silicon gate layer (e.g. an amorphous silicon gate layer or a polysilicon gate layer) overlying the gate oxide layer. A cobalt layer is then deposited on the PMOS transistor structure. The PMOS transistor structure and the cobalt layer are subsequently subjected to a first thermal treatment at, for example, a temperature of 500° C. to 550° C. in order to form a bilayer CoSis/silicon stack structure. After removal of any unreacted cobalt, boron dopant (e.g., $BF_2^+$ or $B^+$) is implanted into the bilayer CoSi/silicon stack structure. Nitrogen atoms (e.g. $N_2^+$) are then implanted into the bilayer CoSi/silicon stack structure. Finally, the bilayer CoSi/silicon stack structure, implanted boron dopant and implanted nitrogen atoms are subjected to a second thermal treatment at, for example, a temperature of 800° C. to 950° C. in order to form a $CoSi_2$ layer. The second thermal treatment is also designed to thermally activate the implanted boron dopant, thereby forming a boron-doped silicon gate layer underlying a cobalt silicide ($CoSi_2$) layer. The presence of nitrogen atoms in the bilayer CoSi/silicon stack structure suppresses grooving and agglomeration of the cobalt silicide layer during the second thermal treatment step. In addition, the CoSi layer of the CoSi/silicon stack structure serves as a boron dopant implantation barrier that significantly reduces the risk of boron dopant penetration into and through the gate oxide layer.

Also provided by the present invention is a process that includes first providing a PMOS transistor structure including an N-type silicon substrate, a gate oxide layer on the silicon substrate, and a silicon gate layer (e.g., an amorphous silicon gate layer or a polysilicon gate layer) overlying the gate oxide layer. Nitrogen atoms (e.g., $N_2+$) are then implanted into the silicon gate layer, followed by the deposition of a cobalt layer on the PMOS transistor structure. The PMOS transistor structure and the cobalt layer are subsequently subjected to a first thermal treatment at, for example, a temperature of 500° C. to 550° C. in order to form a bilayer CoSi/silicon stack structure. Any unreacted cobalt is then removed. Next, boron dopant (e.g., $BF_2^+$ or $B^+$) is implanted into the bilayer CoSi/silicon stack structure. Finally, the bilayer CoSi/silicon stack structure, implanted boron dopant and implanted nitrogen atoms are subjected to a second thermal treatment at, for example, a temperature of 800° C. to 950° C. in order to form a $CoSi_2$ layer. The second thermal treatment is also designed to thermally activate the implanted boron dopant, thereby forming a boron-doped silicon gate layer underlying a cobalt silicide ($CoSi_2$) layer. In this process, the presence of nitrogen atoms in the silicon gate layer suppresses agglomeration and grooving of cobalt silicide layer during both the first and the second thermal treatment steps. In addition, the CoSi layer on the upper surface of the CoSi/silicon stack structure serves as a boron dopant implantation barrier that significantly reduces the risk of boron dopant penetration into and through the gate oxide layer.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

Figure 2:
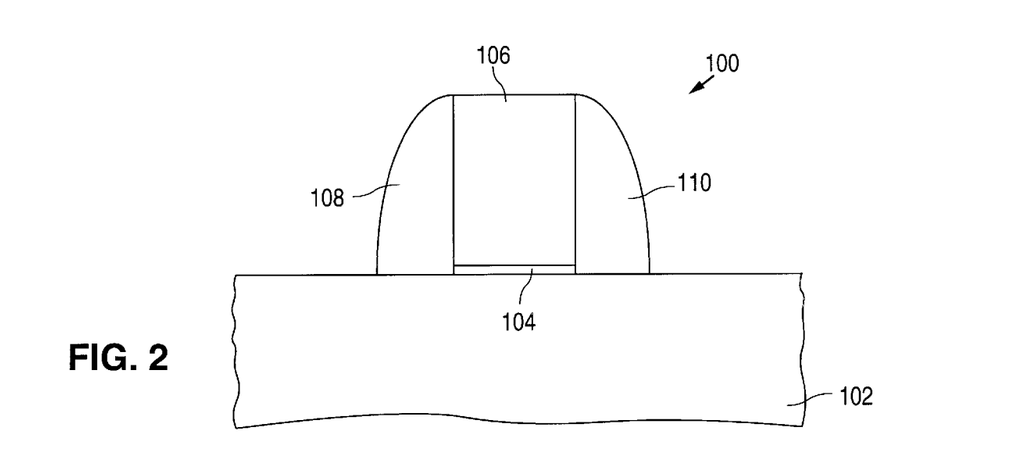
FIGS. 2–7 are cross-sectional views illustrating stages of a process in accordance with the present invention.

FIGS. 2–7 illustrate stages of a process for forming a boron-doped silicon gate layer underlying a cobalt silicide layer in accordance with the present invention. The process includes first providing an PMOS transistor structure 100 with an N-type silicon substrate 102. The PMOS transistor structure also includes a gate oxide layer 104 (for example, 25 angstroms to 50 angstroms thick) on the silicon substrate 102, as well as a silicon gate layer 106 (typical thickness being, for example, in the range between 1000 angstroms and 1350 angstroms) overlying the gate oxide layer 104, as shown in FIG. 2.

Silicon gate layer 106 can be formed of, for example, either amorphous silicon or polysilicon. Amorphous silicon is preferred, however, since an amorphous silicon gate layer can serve as a superior dopant barrier due to the inherent absence of grain boundaries therein. In this regard, it should be noted that an amorphous silicon gate layer will remain amorphous, even after the first thermal treatment step described below. For any given implant energy, the depth of boron dopant penetration, as well as susceptibility to boron dopant penetration, are therefore less in an amorphous silicon gate layer than in a polysilicon gate layer. Amorphous silicon gate layers are also preferred due to their relatively smooth surface, which is particularly beneficial in photolithographic processing.

PMOS transistor structure 100 also includes first gate sidewall spacer 108 and second gate sidewall spacer 110, both of which abut lateral surfaces of the silicon gate layer 106 and the gate oxide layer 104. These first and second gate sidewall spacers 108 and 110 are made, for example, of CVD silicon nitride, silicon dioxide, or combination of silicon nitride and silicon dioxide and have a typical width (measured at the bottom of the gate sidewall spacer) in the range of 500 angstroms to 1000 angstroms.

Figure 3:
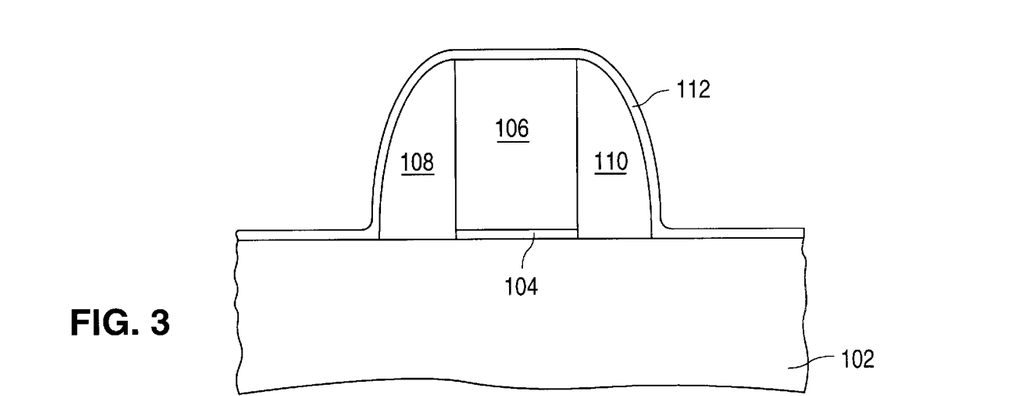
Figure 4:
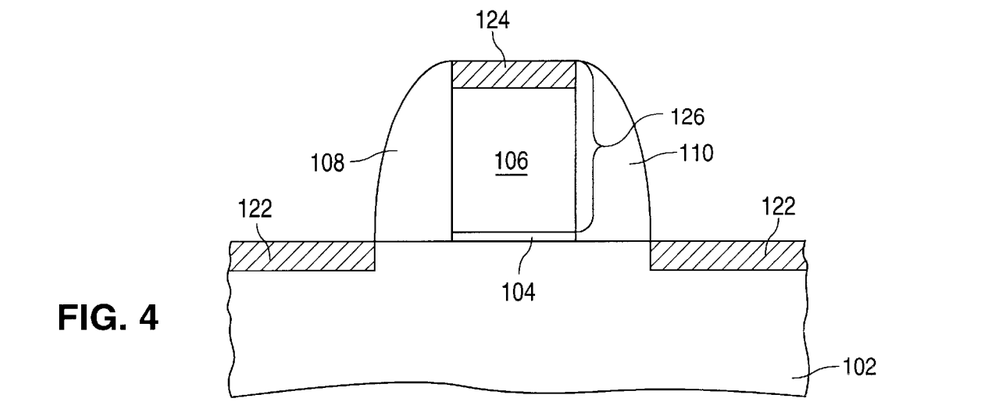

Next, a cobalt layer 112 is deposited over PMOS transistor structure 100 completely covering the N-type silicon substrate 102, silicon gate layer 106, first gate sidewall spacer 108 and second gate sidewall spacer 110. The resultant structure is illustrated in FIG. 3. The cobalt layer thickness is preferably in the range of 100 to 120 angstroms. Cobalt layer 112 can be deposited by any process known in the art, for example, sputtering or chemical vapor deposition.

Next, cobalt in the cobalt layer 112 that is in direct contact with silicon in the N-type silicon substrate 102 and the silicon gate layer 106 is reacted, via a first thermal treatment step, to form self-aligned cobalt silicide (CoSi) layers 122, 124 thereon, respectively. The term "self-aligned" refers to the fact that the cobalt silicide layers 122 and 124, being the products of a reaction between cobalt and silicon, are "self-aligned" to the silicon surfaces of the N-type silicon substrate 102 and silicon gate layer 106, respectively. The combination of a CoSi layer and a silicon gate layer is referred to herein as a bilayer CoSi/silicon stack structure 126. The cobalt-silicon reaction can be conducted using procedures well known to those skilled in the art. Typical procedures employ elevated temperatures, for example, 500° C. to 550° C. in nitrogen ($N_2$) for 30 to 90 seconds, in order to foster the silicide formation and the reactions are normally conducted in a rapid thermal processor (RTP). The cobalt layer 112 (i.e. unreacted cobalt from the cobalt-silicon reaction to form a cobalt silicide layer) is subsequently removed using a conventional selective wet etch, such as a 2:3 ratio mixture of phosphoric acid ($H_3PO_4$) and hydrogen peroxide ($H_2O_2$) for a period of 20 minutes. The resultant structure, illustrated in FIG. 4, includes self-aligned cobalt silicide (CoSi) layers 122 and 124 on the N-type silicon substrate 102 and the silicon gate layer 106, respectively.

Figure 5:
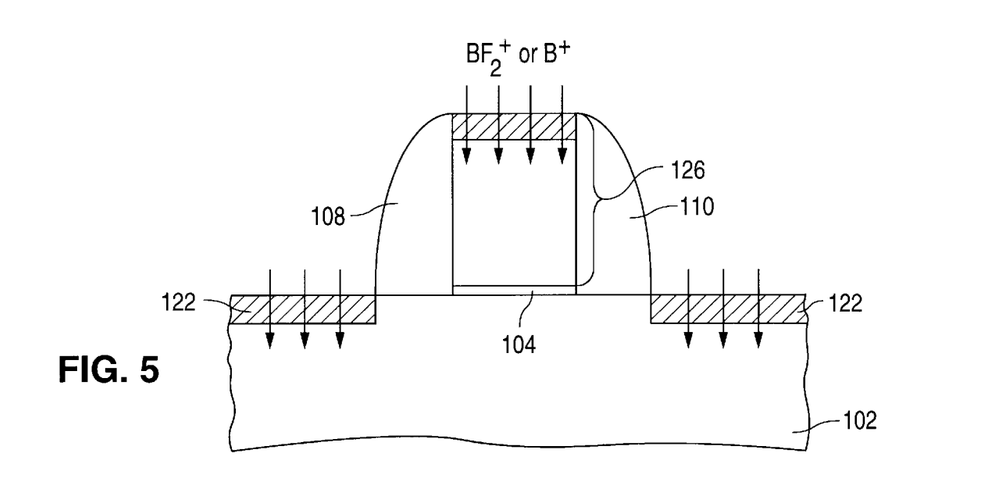

Next, boron dopant is implanted into the bilayer CoSi/silicon stack structure 126, as well as into the self-aligned cobalt silicide layer 122 and the silicon substrate 102 thereunder, as shown in FIG. 5. The boron dopant can be implanted as, for example, either $BF_2^+$ or $B^+$ ions using ion implantation techniques and equipment that are well known in the art. A typical dose and energy range for a $BF_2^+$ implant in processes according to the present invention are 5E15 ions per cm$^2$ and 40–50 KeV, respectively. A typical dose and energy range for a $B^+$ implant in processes according to the present invention are 5E15 ions per cm$^2$ and 20–30 KeV, respectively. The energy of the boron dopant implantation is predetermined based on the desired depth of penetration of boron dopant (i.e. the concentration peak of the Gaussian distribution that results from the implant process, which is known as the "projected range" or Rp) into the bilayer CoSi/silicon stack structure 126. It is preferred that Rp for the boron dopant implantation be less than the thickness of the bilayer CoSi/silicon stack structure 126 in order to insure that boron dopant is not implanted into the gate oxide layer 104. It is also preferred that the implanted boron dopant be limited to the upper portion of the bilayer CoSi/silicon stack structure 126 and that the subsequent second thermal treatment step be used to diffuse (i.e. "drive") the implanted boron dopant throughout the silicon gate layer 106.

It should be noted that, in the absence of a cobalt silicide (CoSi) layer, the implantation of $B^+$ directly into a relatively thin (e.g. less than 1500 angstrom) amorphous silicon gate layer or polysilicon gate layer is difficult since it requires a relatively low energy, and therefore relatively unfocused, $B^+$ implantation process. The presence of a bilayer CoSi/silicon stack structure 126 in processes according to the present invention, however, enables the use of relatively high energy, and thus well focused, $B^+$ implantation processes, while minimizing the risk of boron dopant penetration into the gate oxide layer.

Figure 6:
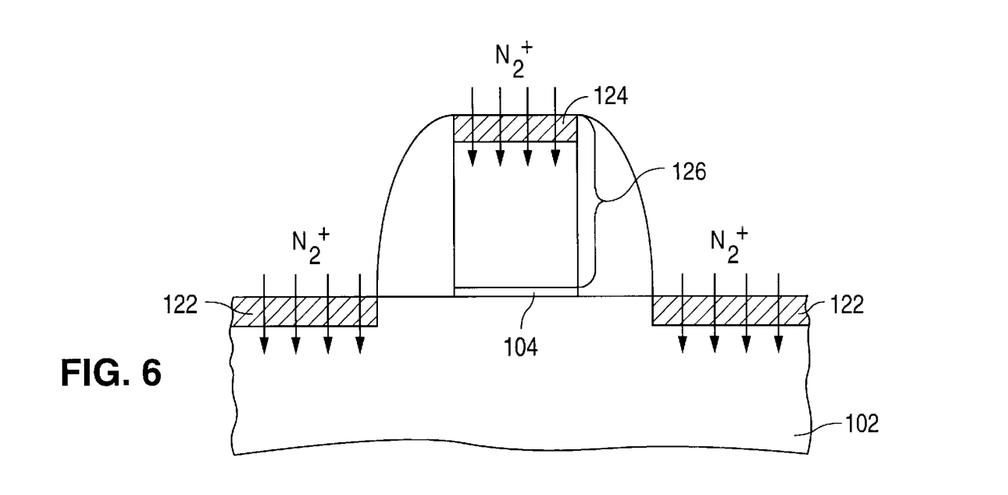

Nitrogen ions are then implanted into the bilayer CoSi/silicon stack structure 126, as well as into the self-aligned cobalt silicide layer 122 and the N-type silicon substrate 102 thereunder, as illustrated in FIG. 6. Typical dose and energy ranges for a $N_2^+$ implant in processes according to the present invention are 1E15 to 6E15 ions per cm$^2$ and 30–40 KeV, respectively. If a lesser $N_2^+$ implant dose is employed, the risk of agglomeration and grooving of cobalt silicide layer will be increased. The $N_2^+$ implant energy is predetermined such that the peak concentration of nitrogen is located just below the CoSi/silicon interface of the bilayer CoSi/silicon stack structure 126. The presence of nitrogen atoms at, and immediately below, the CoSi/silicon interface of the bilayer CoSi/silicon stack structure 126 suppresses thermal grooving and agglomeration of CoSi$_2$ layer during a subsequent second thermal treatment step. For a process in which a 100 angstrom thick cobalt layer 112 is employed, the first thermal treatment step will typically produce a self-aligned cobalt silicide (CoSi) layer 124 that is approximately 300 angstroms in thickness. For this situation, the peak concentration of implanted nitrogen atoms (i.e. Rp for the nitrogen implant) is preferably located about 50 angstroms below the CoSi/silicon interface (i.e. at a depth of about 350 angstroms below the upper surface of the self-aligned cobalt silicide layer 124).

Figure 7:
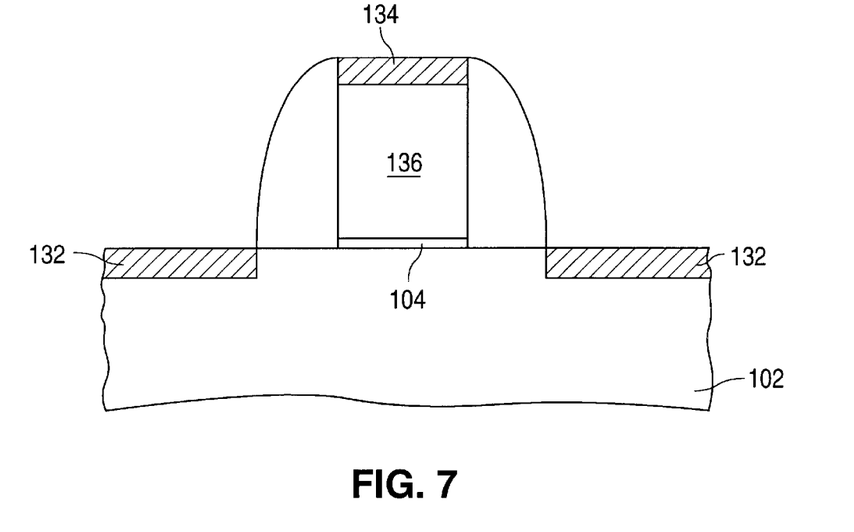

Finally, the bilayer CoSi/silicon stack structure 126, implanted boron dopant and implanted nitrogen atoms are subjected to a second thermal treatment to form a bilayer CoSi$_2$/silicon stack structure. The second thermal treatment also thermally activates the implanted boron dopant, thereby forming a boron-doped silicon gate layer underlying a cobalt silicide layer (CoSi$_2$). This second thermal treatment step converts the self-aligned cobalt silicide (CoSi) layers 122 and 124 to self-aligned cobalt silicide (CoSi$_2$) layers 132 and 134, respectively, that are more stable than CoSi and that provide the desired low sheet resistance. This second thermal treatment step also activates the boron dopant in the silicon gate layer 106, thereby creating boron-doped silicon gate layer 136. The resulting structure is illustrated in FIG. 7. The second thermal treatment step can be conducted, for example, in an RTP at 800° C. –950° C. for 30 to 90 seconds in an N$_2$ ambient. The presence of implanted nitrogen atoms provides for the use of unusually high temperatures (e.g. 950° C.) during the second thermal treatment step to insure complete activation of the boron dopant that has been implanted into the silicon gate layer. Such high temperatures would, in the absence of implanted nitrogen atoms, result in grooving and agglomeration of the cobalt silicide layer, as well as boron dopant penetration into the gate oxide layer. The assumption here is that agglomeration of the cobalt silicide layer will not have occurred at the relatively low temperatures (e.g. 500° C. to 550° C.) employed in the first thermal treatment step, thus a nitrogen implantation step prior to the first thermal treatment step is not necessary.

In another embodiment, a process according to the present invention is identical to that described immediately above and in relation to FIGS. 2–7, except that the nitrogen implantation step is conducted prior, rather than subsequent, to the cobalt layer deposition step. Therefore, in this process, nitrogen ions are implanted directly into the silicon gate layer, rather than into a bilayer CoSi/silicon stack structure. The nitrogen implant energy is predetermined such that the peak concentration of nitrogen will be located immediately below the CoSi/silicon interface of the subsequently formed bilayer CoSi/silicon stack structure. Contrary to the previous assumption, the assumption here is that agglomeration of cobalt silicide layer may possibly occur at the relatively low temperatures (e.g. 500° C. to 550° C.) employed in the first thermal treatment step. Nitrogen is, therefore, implanted prior to the first thermal treatment step in order to prevent grooving and agglomeration of cobalt silicide layer from occurring during both the first thermal treatment step and the second thermal treatment step.

To verify that processes in accordance with the present invention provide for the formation of a boron-doped silicon gate layer underlying a cobalt silicide layer without grooving and agglomeration thereof and with negligible boron dopant penetration into a gate oxide layer, a series of test samples was prepared and characterized as follows. Each of the test samples was prepared by growing a 40 angstrom thermal gate oxide layer on P-type (100) silicon substrates. The gate oxide layer was grown in a wet ambient at 750° C. and annealed at 900° C. in N$_2$O for 20 minutes to produce a "nitrided" gate oxide layer. Either an amorphous silicon gate layer, 150 nm or 125 nm in thickness, deposited using low pressure chemical vapor deposition (LPCVD) at 550° C., or a polysilicon gate layer (125 nm in thickness) was then deposited. The resulting structures were then subjected to processes in accordance with the present invention and characterized as described hereafter.

Figure 8:
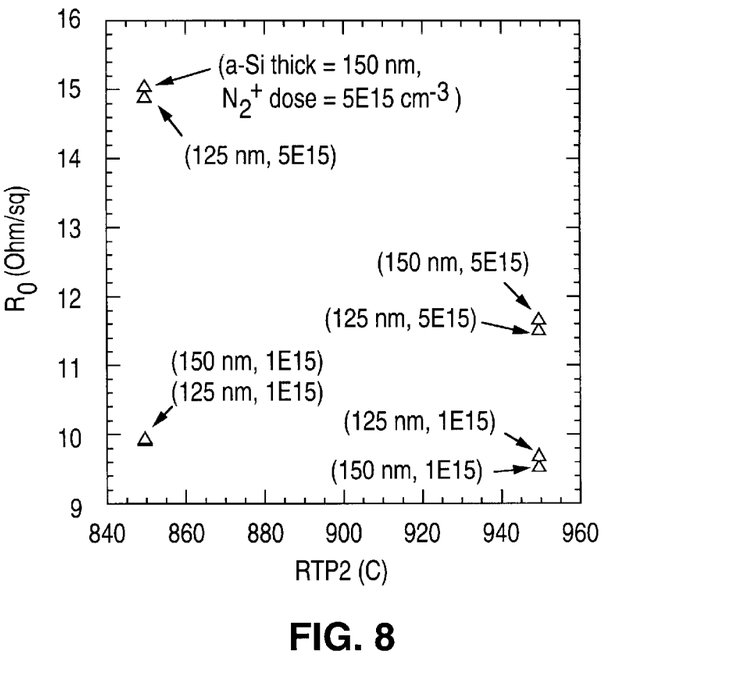
FIG. 8 is a graph of test sample sheet resistance versus second thermal treatment step temperature (RTP2).

FIG. 8 illustrates the average sheet resistance versus second thermal treatment temperature for eight amorphous silicon test samples prepared using a 100 angstrom cobalt layer deposition, followed by a 525° C. first thermal treatment for 60 seconds, a 50 KeV, 5E15 per cm$^2$ $BF_2^+$ implant, and then a 30 KeV energy $N_2^+$ implant. The $N_2^+$ implant dose and second thermal treatment step temperature (RTP2) for each of the eight test samples are as indicated in the figure. The data of FIG. 8 indicate that the larger N$_2$ dose (i.e., 5E15 ions per cm$^2$) resulted in a higher sheet resistance, irrespective of the second thermal treatment step temperature. For the test sample prepared using a second thermal treatment step at 850° C. and an $N_2^+$ dose of 5E15 ions per $cm^2$, the average sheet resistance was relatively high at about 15 ohm/sq. It is known that the growth of $CoSi_2$ from CoSi occurs predominantly by cobalt diffusion. See, for example, G. J. van Gurp, et al., Interactions in the Co/Si Thin-Film System. II. Diffusion-Marker Experiments, J. Appl. Phys., 49, 4011, (1978), which is hereby incorporated by reference. Cobalt diffusion through $CoSi_2$ is slow and has a high activation energy. See T. Barge, et al., Cobalt Lattice Diffusion in Bulk Cobalt Disilicide, Appl. Surf. Sci., 53, 180 (1991), which is hereby incorporated by reference. Nitrogen at the cobalt/silicon interface could prevent or slow cobalt diffusion into the silicon gate layer and, thereby, the formation of a $CoSi_2$ layer. On the other hand, at the relatively high temperature of 950° C., nitrogen could diffuse more deeply into the silicon gate layer, thereby allowing silicon to be available for $CoSi_2$ formation. Alternatively, an increase in cobalt diffusivity at this relatively high temperature could enable more cobalt atoms to diffuse and form $CoSi_2$. From FIG. 8, it is also apparent that that the lower $N_2^+$ dose (i.e. 1E15 ions per $cm^2$) resulted in lower sheet resistance with 950° C. annealing for both the 125 nm and 150 nm thick amorphous silicon gate layer test samples. A conclusion drawn from the data of FIG. 8, however, is that the quality of the cobalt silicide ($CoSi_2$) layer does not appear to be degraded by grooving or agglomeration, even when the second thermal treatment step was conducted at 950° C.

Figure 9:
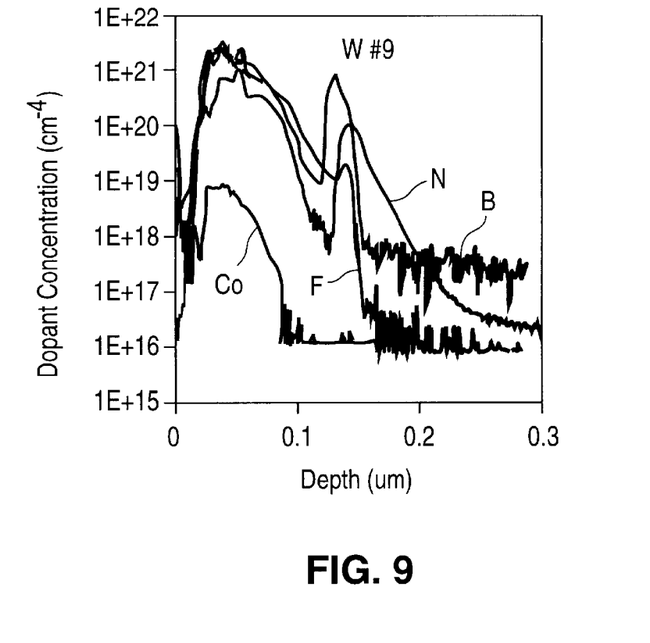
FIGS. 9 and 10 are SIMS concentration profiles for test samples prepared by processes in accordance with the present invention.
Figure 10:
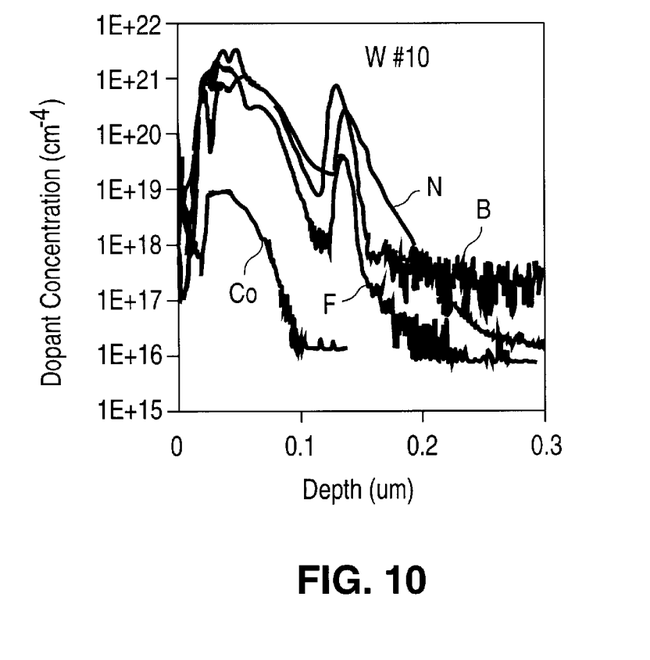

FIG. 9 is a secondary ion mass spectrometry (SIMS) concentration profile for a test sample prepared with a 125 nm polysilicon gate layer, a 100 angstrom cobalt deposition, a 515° C. first thermal treatment, a 50 KeV and 5E15 per $cm^2$ $BF_2^+$ implant, and then a 30 KeV energy and 5E15 per $cm^2 N_2^+$ implant, followed by a second thermal treatment step at 850° C. for 60 seconds. FIG. 10 is a SIMS concentration profile for a test sample prepared in an identical manner to that of FIG. 9, except the second thermal treatment step was conducted at 950° C. for 60 seconds.

In FIGS. 9 and 10, the non-uniformity of the SIMS profiles near the surface is due to the surface roughness of the samples caused by the heavy dose implants of $BF_2^+$ and $N_2^+$ ions through the CoSi layer. There appear to be secondary ion concentration peaks for nitrogen, fluorine and boron at the interface of the polysilicon gate layer and the gate oxide layer. Fluorine concentration decreases abruptly across the gate oxide layer, but nitrogen has diffused into the silicon substrate producing a slowly diminishing nitrogen concentration "tail." The nitrogen concentration peak is caused by nitrogen diffusion, as well as by the presence of nitrogen in the nitrided gate oxide layer. Boron concentration at the polysilicon gate/gate oxide interface in the 950° C. test sample is slightly more than that of 850° C. test sample. The higher temperature could have allowed more boron dopant to diffuse towards the interface, doped the polysilicon more uniformly, and activated the boron atoms more completely. The cobalt concentration profile in both samples appear similar, with the cobalt concentration peak being at 0.04 to 0.05 microns from the surface of the samples and the cobalt concentration decreasing by two orders of magnitude from its peak concentration of 1E19 per $cm^3$ at a depth of approximately 0.04 microns into the polysilicon gate layer. This sharp decrease in concentration confirms that grain boundary grooving of the cobalt silicide layer is negligible.

It should be understood that various alternatives to the embodiments of the invention described herein may be employed in practicing the invention. For example, while specific layer dimensions, implant doses and implant energies have been set forth to illustrate the invention, they are not intended to limit the invention. It is intended that the following claims define the scope of the invention and that methods within the scope of these claims and their equivalents be covered thereby.

What is claimed is:

1. A method for the formation of a boron-doped silicon gate layer underlying a cobalt silicide layer comprising the steps of:
    providing a PMOS transistor structure comprising:
        an N-well on a P-type silicon substrate;
        a gate oxide layer on the N-well; and
        a silicon gate layer overlying the gate oxide layer;
    depositing a cobalt layer on the PMOS transistor structure;
    subjecting the PMOS transistor structure and the cobalt layer to a first thermal treatment to form a bilayer CoSi/silicon stack structure and unreacted cobalt;
    removing the unreacted cobalt;
    implanting boron into the bilayer CoSi/silicon stack structure;
    implanting nitrogen into the bilayer CoSi/silicon stack structure, thereby producing a nitrogen concentration profile in the bilayer CoSi/silicon stack structure with a peak nitrogen concentration located immediately below the CoSi/silicon interface;
    subjecting the bilayer CoSi/silicon stack structure, implanted boron and implanted nitrogen to a second thermal treatment to form a $CoSi_2$ layer and to thermally activate the implanted boron, thereby forming a boron-doped silicon gate layer underlying a cobalt silicide ($CoSi_2$) layer.

2. The method of claim 1 wherein the implanting boron step includes implanting a boron-containing ion species selected from the group consisting of boron ions ($B^+$) and boron difluoride ions ($BF_2^+$).

3. The method of claim 1 wherein the first thermal treatment is coducted at a temperature in the range of 500° C. and 550° C.

4. The method of claim 1 wherein the second thermal treatment is conducted at a temperature in the range of 850° C. to 950° C.

5. The method of claim 1 wherein the step of providing a PMOS transistor structure includes providimg a PMOS transistor structure with a silicon gate layer selected from the group consisting of amorphous silicon gate layers and polysilicon gate layers.

6. A method for the formation of a boron-doped silicon gate layer underlying a cobalt silicide layer comprising the steps of:
    providing a PMOS transistor structure comprising:
        an N-well on a P-type silicon substrate;
        a gate oxide layer on the N-well; and
        a silicon gate layer overlying the gate oxide layer;
    implanting nitrogen into the silicon gate layer;
    depositing a cobalt layer on the PMOS transistor structure;
    subjecting the PMOS transistor structure and the cobalt layer to a first thermal treatment to form a bilayer CoSi/silicon stack structure and unreacted cobalt;
    removing the unreacted cobalt;
    implanting boron into the bilayer CoSi/silicon stack structure;

subjecting the bilayer CoSi/silicon stack structure, the implanted boron and the implanted nitrogen to a second thermal treatment to thermally activate the implanted boron, thereby forming a boron-doped silicon gate layer underlying a cobalt silicide ($CoSi_2$) layer, wherein the implanting nitrogen step results in a nitrogen concentration profile in the subsequently formed bilayer CoSi/silicon stack structure with a peak nitrogen concentration located immediately below the CoSi/silicon interface.

7. The method of claim 6 wherein the implanting boron step includes implanting a boron-containing ion species selected from the group consisting of boron ions ($B^+$) and boron difluoride ions ($BF_2^+$).

8. The method of claim 6 wherein the first thermal treatment is conducted at a temperature in the range of 500° C. to 550° C.

9. The method of claim 7 wherein the second thermal treatment is conducted at a temperature in the range of 850° C. to 950° C.

10. The method of claim 8 wherein the step of providing a PMOS transistor structure includes providing a PMOS transistor structure with a silicon gate layer selected from the group consisting of amorphous silicon gate layers and polysilicon gate layers.

* * * * *

UNITED STATES PATENT AND TRADEMARK OFFICE
CERTIFICATE OF CORRECTION

PATENT NO. : 6,242,348 B1
DATED : June 5, 2001
INVENTOR(S) : Kamal et al.

Page 1 of 1

It is certified that error appears in the above-identified patent and that said Letters Patent is hereby corrected as shown below:

<u>Column 8,</u>
Line 41, "coducted" should be -- conducted --
Line 47, "providimg" should be -- providing --

Signed and Sealed this

Twenty-fifth Day of December, 2001

Attest:

*Attesting Officer*

JAMES E. ROGAN
*Director of the United States Patent and Trademark Office*